(12) United States Patent
Indrakanti et al.

(10) Patent No.: US 9,263,331 B2
(45) Date of Patent: Feb. 16, 2016

(54) METHOD FOR FORMING SELF-ALIGNED CONTACTS/VIAS WITH HIGH CORNER SELECTIVITY

(71) Applicant: Lam Research Corporation, Fremont, CA (US)

(72) Inventors: Ananth Indrakanti, Fremont, CA (US); Peng Wang, Clifton Park, NY (US); Eric A. Hudson, Berkeley, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/801,624

(22) Filed: Jul. 16, 2015

(65) Prior Publication Data

US 2015/0325479 A1 Nov. 12, 2015

Related U.S. Application Data

(63) Continuation of application No. 14/105,073, filed on Dec. 12, 2013, now Pat. No. 9,105,700.

(51) Int. Cl.

| | |
|---|---|
| *H01L 21/4763* | (2006.01) |
| *H01L 21/768* | (2006.01) |
| *H01L 21/311* | (2006.01) |
| *H01L 21/3105* | (2006.01) |
| *H01L 21/67* | (2006.01) |
| *H01J 37/32* | (2006.01) |

(52) U.S. Cl.
CPC ..... *H01L 21/76897* (2013.01); *H01J 37/32082* (2013.01); *H01J 37/32449* (2013.01); *H01J 37/32532* (2013.01); *H01J 37/32715* (2013.01); *H01L 21/31051* (2013.01); *H01L 21/31116* (2013.01); *H01L 21/31144* (2013.01); *H01L 21/67069* (2013.01); *H01L 21/76802* (2013.01); *H01L 21/76819* (2013.01); *H01L 21/76877* (2013.01)

(58) Field of Classification Search
CPC .............. H01L 21/768; H01L 21/7681; H01L 21/76814; H01L 21/76879; H01L 21/76897; H01L 23/52; H01L 23/522; H01L 23/5226
USPC .................. 438/622, 624, 626, 631, 633, 634
See application file for complete search history.

(56) References Cited

U.S. PATENT DOCUMENTS

| | | | |
|---|---|---|---|
| 6,905,622 | B2 | 6/2005 | Padhi et al. |
| 8,668,835 | B1 | 3/2014 | Indrakanti et al. |
| 9,105,700 | B2 * | 8/2015 | Indrakanti ......... H01L 21/76897 |
| 2004/0067634 | A1 | 4/2004 | Kim et al. |

OTHER PUBLICATIONS

Notice of Allowance dated Apr. 9, 2015 from U.S. Appl. No. 14/105,073.
Office Action dated Jan. 16, 2015 from U.S. Appl. No. 14/105,073.

* cited by examiner

*Primary Examiner* — Kevin M Picardat
(74) *Attorney, Agent, or Firm* — Beyer Law Group LLP

(57) ABSTRACT

A method of etching self-aligned contact/via features in a low-k dielectric layer disposed below a hardmask, which is disposed below a planarization layer. At least one cycle is provided, where each cycle comprises thinning the planarization layer, forming a deposition layer on the hardmask and planarization layer; and etching the low-k dielectric layer masked by the deposition layer.

13 Claims, 7 Drawing Sheets

US 9,263,331 B2

METHOD FOR FORMING SELF-ALIGNED CONTACTS/VIAS WITH HIGH CORNER SELECTIVITY

CROSS REFERENCE TO RELATED APPLICATION

This application is a continuation of pending U.S. application Ser. No. 14/105,073, filed on Dec. 12, 2013 and entitled "METHOD FOR FORMING SELF-ALIGNED CONTACTS/VIAS WITH HIGH CORNER SELECTIVITY" which is incorporated herein by reference in its entirety for all purposes.

BACKGROUND OF THE INVENTION

The present invention relates to etching self-aligned vias during the production of a semiconductor device. More specifically, the present invention relates to etching self-aligned vias in a multi-layered dielectric stack.

During semiconductor wafer processing, self-aligned via features may be etched into a dielectric layer. As device sizes shrink the metallization of self-aligned via features becomes more problematic. These problems may cause more defects.

SUMMARY OF THE INVENTION

To achieve the foregoing and in accordance with the purpose of the present invention, a method of etching self-aligned contact/via features in a low-k dielectric layer disposed below a hardmask, which is disposed below a planarization layer. At least one cycle is provided, where each cycle comprises thinning the planarization layer, forming a deposition layer on the hardmask and planarization layer; and etching the low-k dielectric layer masked by the deposition layer.

In another manifestation of the invention, a method of etching self-aligned contacts/vias in a low-k dielectric layer disposed below a trench hardmask, which is disposed below a planarization layer, disposed below a via mask is provided. The planarization layer is etched through the vias mask to the low-k dielectric layer. Self-aligned vias are etched in the low-k dielectric layer through the planarization layer and the trench hardmask, comprising at least one cycle, where each cycle comprises thinning the planarization layer, forming a deposition layer on the hardmask and planarization layer, and etching the low-k dielectric layer masked by the deposition layer. The planarization layer is removed. Trenches are etched into the low-k dielectric layer through the trench hardmask.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Mixed mode pulsed (MMP) etching is helpful in etching self aligned vias and trenches in a multilayer film stack, as described in "METHOD OF ETCHING SELF-ALIGNED VIAS AND TRENCHES IN A MULTI-LAYER FILM STACK," by Ananth Indrakanti et al. filed on Jan. 23, 2013, as U.S. application Ser. No. 13/748,249, now U.S. Pat. No. 8,668,835, which is incorporated by reference for all purposes.

Figure 1:
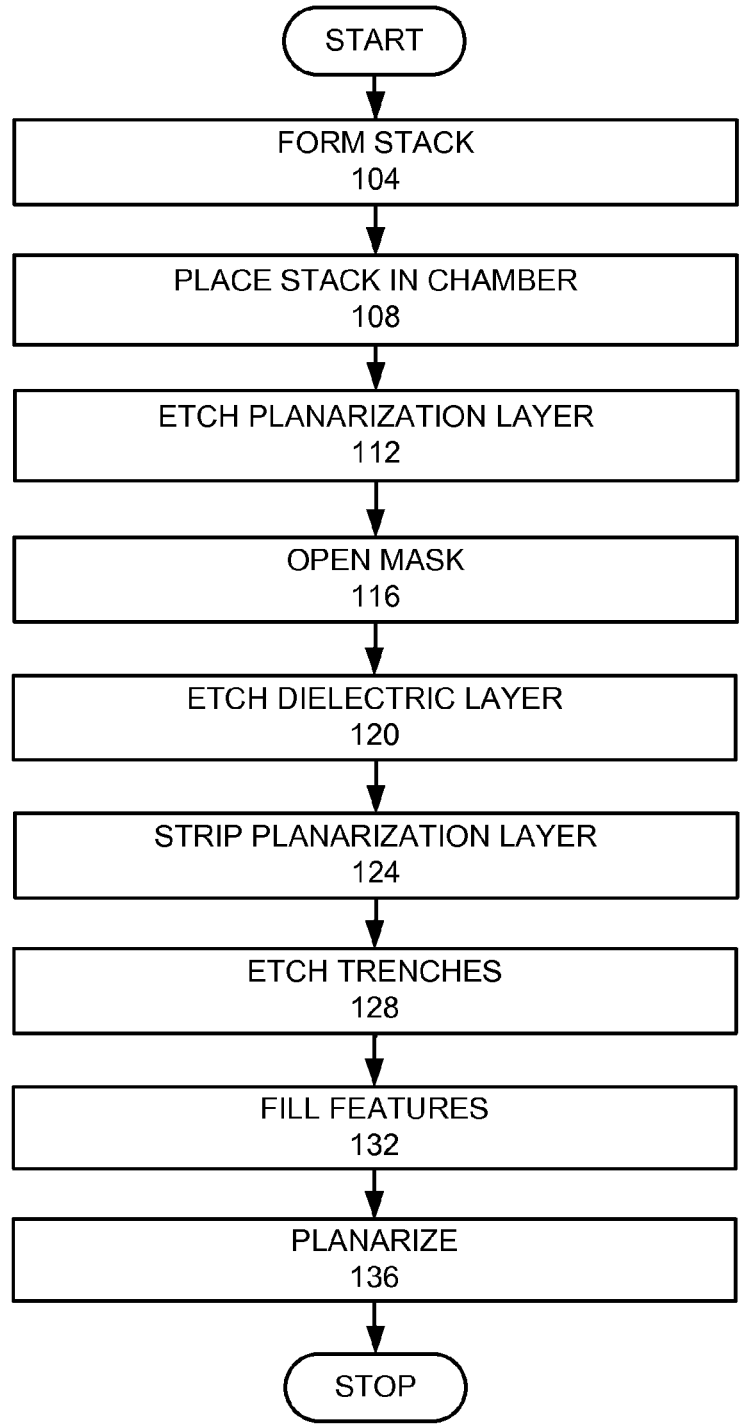
FIG. 1 is a high level flow chart of an embodiment of the invention.

To facilitate understanding, FIG. 1 is a high level flow chart of a process used in an embodiment of the invention. A stack is formed (step 104). The stack is placed in a plasma processing chamber (step 108). A planarization layer is etched (step 112). A mask is opened (step 116). A dielectric layer is etched (step 120). A planarization layer is stripped (step 124). Trenches are etched (step 128). Features are filled (step 132). The resulting stack is planarized (step 136).

EXAMPLES

Figure 2A:
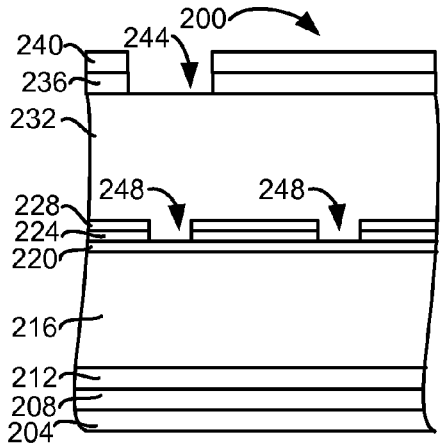
FIGS. 2A-P are schematic views of a stack processed according to an embodiment of the invention.

In an example of the invention, a stack is formed (step 104). FIG. 2A is a cross-sectional view of a stack 200 used in an embodiment of the invention. A substrate 204 is provided. The substrate 204 may be a silicon wafer or may be a stack including a wafer. In this example, a top layer of a stack forming the substrate 204 is a silicon oxide dielectric layer. A barrier layer 208 is formed over the substrate 204. In this example, the barrier layer 208 is silicon nitride (SiN), silicon carbide (SiC), silicon carbon nitride (SiCN), N-BloK, oxygen doped silicon carbide (ODC), nitrogen doped silicon carbide (NDC). An etch stop layer 212 is formed over the barrier layer 208. In this example, the etch stop layer 212 is TEOS or another dielectric material that is different from the barrier layer 208. A dielectric layer 216 is formed over the etch stop layer 212. Preferably, the dielectric layer 216 is of a low-k dielectric material, with a k<4.3. More preferably, the dielectric layer 216 has a k<2.7. The dielectric layer 216 may be made of a porous low-k material. An example of such a low-k material forming the dielectric layer 216 is Black Diamond II (BDII). Above the dielectric layer is a first hardmask layer 220. The first hardmask layer 220 is a material that provides selective etching of the dielectric layer 216 with respect to the first hardmask layer 220. In this example, the first hardmask layer 220 may be a silicon oxide film such as tetraethyl orthosilicate (TEOS), SiC, SiN, silicon oxynitride (SiON), or silicon carbonitride (SiCN). In this example, the first hardmask layer 220 has a thickness of less than or equal to 10 nm. In other examples, the thickness of the first hardmask layer 220 is 10-15 nm. A patterned metal hardmask 224 is formed above the first hardmask layer 220. The patterned metal hardmask 224 comprises a metal containing component. The patterned metal hardmask 224 may be formed from titanium nitride (TiN), tungsten nitride (WN), tungsten silicon nitride (WSiN), titanium silicon nitride (TiSiN), titanium tantalum nitride (TiTaN), and titanium ruthenium nitride (TiRuN). In this example, the patterned metal hardmask 224 is formed from TiN. In this example the patterned metal hardmask 224 has a thickness of less than or equal to 10 nm. More preferably, in this example the thickness of the patterned metal hardmask 224 is 5-10 nm. A second hardmask 228 that is used to pattern the metal hardmask 224 exists above the metal hardmask 224. The second hardmask 228 may be of the same material as the first hardmask layer 220. In this example, the second hardmask 228 is TEOS. In this example, the second hardmask 228 has a thickness of less than or equal to 10 nm.

Above the second hardmask 228 is a via mask. In this example, the via mask is formed by a tri-layer mask. A bottom layer of the tri-layer mask is a planarization layer 232. The planarization layer 232 is formed from an organic material in this example. A middle layer of the tri-layer mask is an antireflective layer 236. In this example, the antireflective layer 236 is a patterned silicon containing antireflective layer. A patterned photoresist mask 240 forms the top layer of the tri-layer mask.

In this example, the patterned photoresist mask 240 and antireflective layer 236 form at least one via opening 244. In this example, the second hardmask 228 and patterned metal hardmask 224 form at least one trench opening 248.

Figure 3:
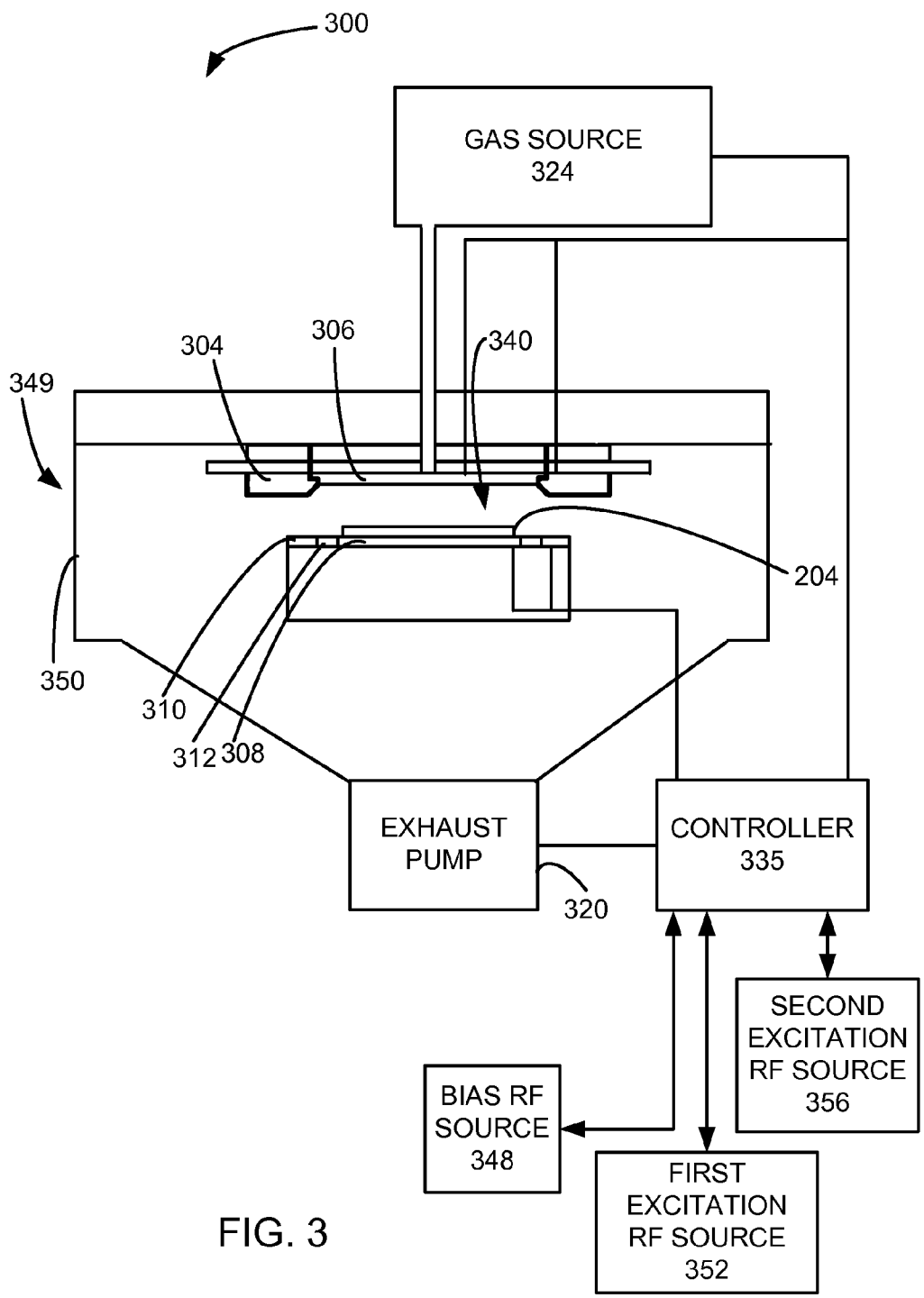
FIG. 3 is a schematic view of an etch reactor that may be used for etching.

The stack 200 is placed in an etch chamber (step 108). FIG. 3 is a schematic view of an etch reactor that may be used in practicing the invention. In one or more embodiments of the invention, an etch reactor 300 comprises a top central electrode 306, top outer electrode 304, bottom central electrode 308, and a bottom outer electrode 310, within a plasma processing chamber 349, enclosed by a chamber wall 350. A bottom insulator ring 312 insulates the bottom central electrode 308 from the bottom outer electrode 310. Also within the plasma processing chamber 349, the substrate 204 is positioned on top of the bottom central electrode 308. The bottom central electrode 308 provides an electrostatic chuck (ESC) for holding the substrate 204. In this embodiment, the bottom outer electrode 310 and the top outer electrode 304 have apertures that have a larger diameter than the substrate 204, so that the substrate 204 is positioned within the apertures.

A gas source 324 is connected to the plasma processing chamber 349 and supplies the etch gas into a plasma region 340 of the plasma processing chamber 349 during the etch processes.

A bias RF source 348, a first excitation RF source 352, and a second excitation RF source 356 are electrically connected to the plasma processing chamber 349 through a controller 335 to provide power to the electrodes 304, 306, 308, and 310. The bias RF source 348 generates bias RF power and supplies the bias RF power to the plasma processing chamber 349. In this example, the bias RF power has a frequency of 2 MHz. The first excitation RF source 352 generates source RF power and supplies the source RF power to the plasma processing chamber 349. In this example, this source RF power has a frequency of 27 MHz. The second excitation RF source 356 generates another source RF power and supplies the source RF power to the plasma processing chamber 349, in addition to the RF power generated by the first excitation RF source 352. In this example, this source RF power has a frequency of 60 MHz.

The different RF signals may be supplied to various combinations of the top and bottom electrodes. Preferably, the lowest frequency of the RF should be applied through the bottom electrode on which the material being etched is placed, which in this example is the bottom central electrode 308. In this example, the top electrodes are grounded and power is only provided to the bottom central electrode 308.

The controller 335 is connected to the gas source 324, the bias RF source 348, the exhaust pump 320, the first excitation RF source 352, and the second excitation RF source 356. The controller 335 controls the flow of the etch gas into the plasma processing chamber 349, the chamber pressure, as well as the generation of the RF power from the three RF sources 348, 352, 356, the electrodes 304, 306, 308, and 310, and the exhaust pump 320.

The top central electrode 306 also serves as a gas distribution plate, which is connected to the gas source 324, and serves as a gas inlet for gas from the gas source 324. The exhaust pump 320 serves as a gas outlet removing gas, which passes from the top central electrode 306 through the plasma region 340 through apertures 302 to the exhaust pump 320. The exhaust pump 320 may help to control pressure.

A Flex FL (no independent inner/outer electrode T control) dielectric etch system made by Lam Research Corporation™ of Fremont, Calif. may be used in a preferred embodiment of the invention. In the Flex EX+Flex FL the upper electrodes are grounded.

Figure 4:
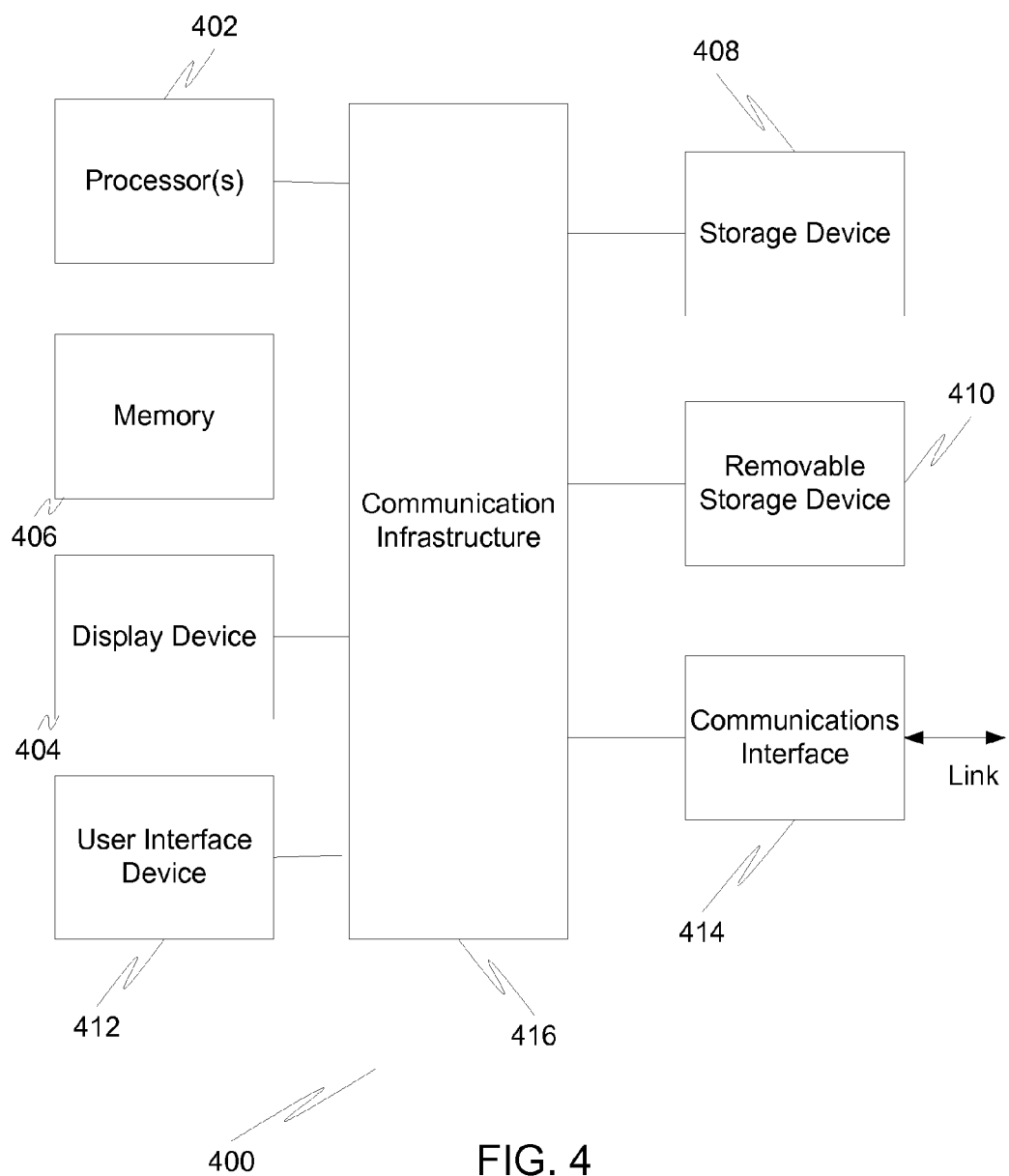
FIG. 4 illustrates a computer system, which is suitable for implementing a controller used in embodiments of the present invention.

FIG. 4 is a high level block diagram showing a computer system 400, which is suitable for implementing a controller 335 used in embodiments of the present invention. The computer system may have many physical forms ranging from an integrated circuit, a printed circuit board, and a small handheld device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
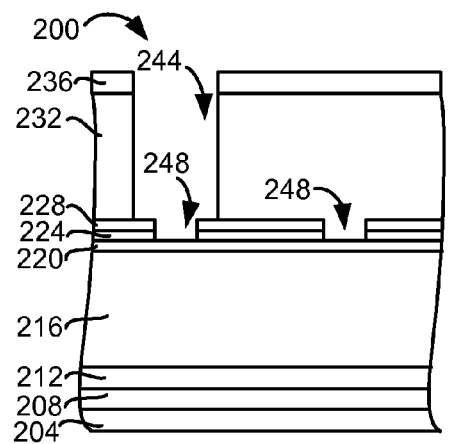

The planarization layer 232 is etched (step 112). In this example, an etch gas comprising $N_2/H_2$; $N_2/O_2$; $N_2/H_2/COS$; $O_2/COS$; or $NH_3$ is provided. FIG. 2B is a cross sectional view of the stack 200 after the planarization layer 232 has been etched. In this example, the patterned photoresist mask 240 is removed while etching the planarization layer 232.

Figure 2C:
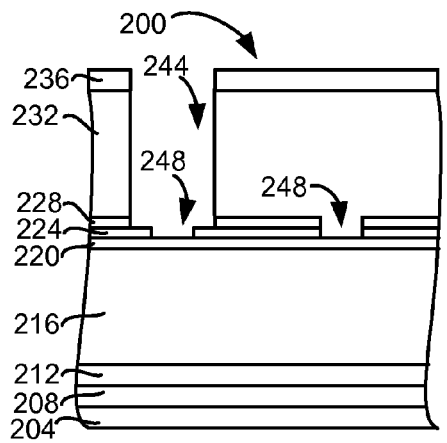

The first hardmask layer 220 is opened (step 116). An opening gas comprises hydrofluorocarbon as an etchant. A mixed mode pulsing plasma etch is provided. RF power is provided at frequencies of 2 MHz and 60 MHz for both state 1 (S1) and state 0 (S0) for the mixed mode pulsing etch. Both frequencies are pulsed synchronously in this step. The mixed mode pulsing provides a 10-30% duty cycle, providing an effectively lower fluorine density than a non-pulsed regime. A first hardmask layer 220 open gas comprising hydrofluorocarbon and $N_2$ is provided for the opening. Although the first hardmask layer 220 opening etches corners away from the TEOS second hardmask 228, the effectively lower fluorine species allows for approximately 0 nm corner patterned metal hardmask 224 loss. Approximately 0 nm corner patterned metal hardmask 224 loss is loss of less than 2 nm. FIG. 2C is a cross-sectional view of the stack 200 after the first hardmask layer 220 is opened. Since in this example, both the first hardmask layer 220 and the second hardmask layer 228 are TEOS, the exposed second hardmask layer 228 is also etched away, as shown. The corners of the patterned metal hardmask 224 are not etched. The antireflective layer 236, which may be SiARC or low-temperature oxide (LTO), is removed in this step.

Figure 5:
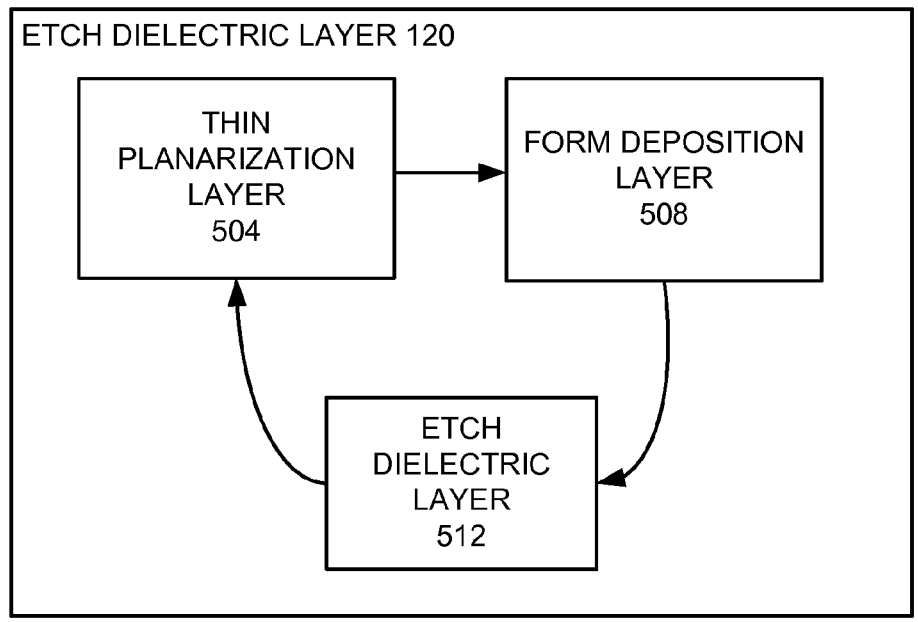
FIG. 5 is a more detailed flow chart of an etch dielectric layer step.

The dielectric layer 216 is etched (step 120) forming self-aligned contact/via features. Contact/via features may be contact features or via features or both. In the remainder of the specification and claims the terms "contact" and "via" may be used interchangeably. A mixed mode pulsing etch is provided. FIG. 5 is a more detailed flow chart of the dielectric layer 216 etch (step 120). The dielectric layer 216 etch step (step 120) comprises at least one cycle where each cycle comprises a planarization layer thinning (step 504), and deposition layer formation (step 508), and a dielectric layer etch (step 512). The step times are more preferably between 3-15 s depending on number of cycles. The number of cycles are preferably more than 2 cycles. More preferably, the number of cycles is between 2-5 cycles.

Figure 2D:
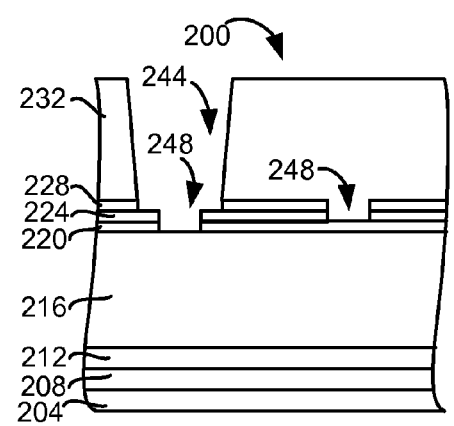

The planarization layer 232 thinning (step 504) uses an $N_2/H_2$ or $NH_3$ based chemistry in this example. Pressure range is maintained at 20-50 mTorr. To achieve directional thinning of planarization layer and preserve CD in the hard mask layer, a low pressure regime is provided. FIG. 2D is a cross-sectional view of the stack 200 after the planarization layer 232 has been thinned (step 504). Part of the top of the planarization layer 232 has been etched away. In addition, the sidewalls of the planarization layer 232 have been etched forming a flare or funnel shape in the planarization layer 232, as shown. This thinning is critical to reduce the aspect ratio of the feature from ~5:1 down to <2:1.

Figure 2E:
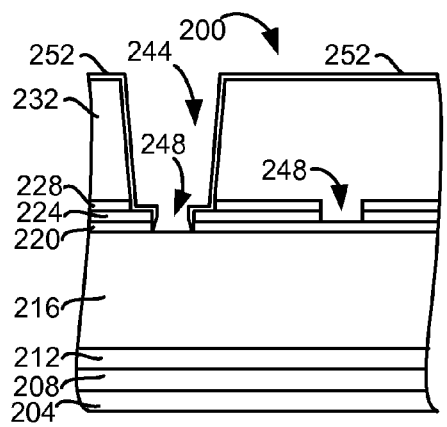

A deposition layer is formed (step 508). A deposition gas comprising a hydrofluorocarbon is used to deposit a layer of passivating polymer on the planarization layer 232 and the patterned metal hard mask 224. A very low bias regime is provided with no more than 300 W of 60 MHz power and less than <50 W of 2 MHz power provided for deposition. A deposition gas comprising hydrofluorocarbon is provided. FIG. 2E is a cross-sectional view of the stack after a deposition layer 252 has been deposited. The corners of the metal hardmask 224 are protected by the deposition layer 252. Preferably, the deposition layer 252 does not deposit on the bottoms of the features, as shown in FIG. 2E. The deposition layer 252 forms a mask over the patterned metal hard mask 224.

Figure 2F:
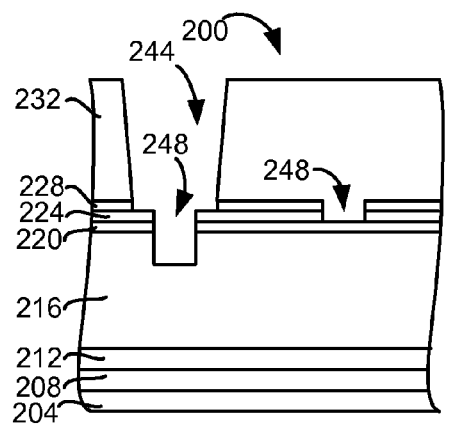

The dielectric layer 216 is etched (step 512). An RF-pulsed condition is provided. An etch gas comprising a hydrofluorocarbon component and a $H_2/N_2$ component is flowed into the etch reactor 300. FIG. 2F is a cross-sectional view of the stack 200 after the dielectric layer 216 has been partially etched (step 512). The deposition layer 252 has been etched away.

Figure 2G:
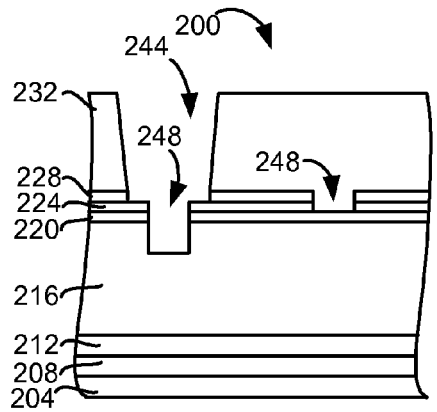
Figure 2H:
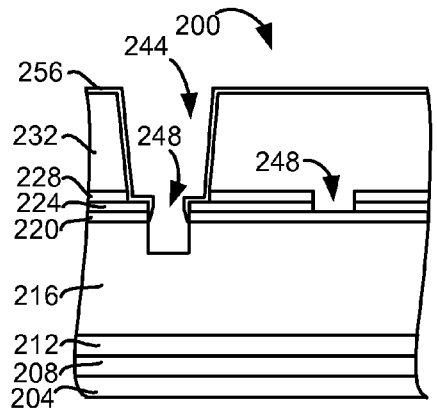
Figure 2I:
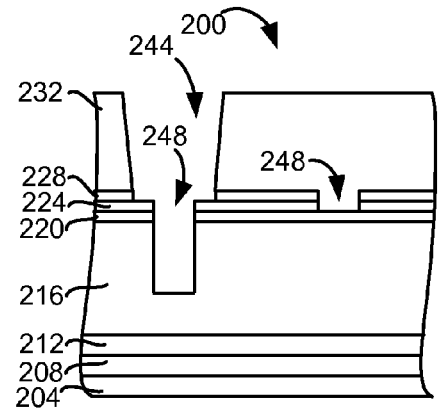

The cycle is repeated, by thinning the planarization layer 232 (step 504). FIG. 2G is a cross-sectional view of the stack 200 after the planarization layer is thinned. A deposition layer is formed (step 508). FIG. 2H is a cross-sectional view of the stack 200 after a deposition layer 256 has been formed (step 504). As mentioned above, the corners of the metal hardmask 224 are protected by the deposition layer 256. In this example, the polymer thickness of the deposition layer 256 decreases further into the vias. This is provided by a pure neutral based deposition. "Neutral based deposition" relies on neutrals or radical species to form a polymer layer at low Aspect Ratio surfaces (minimized ion action. Such a deposition provides protection of the corners of the metal hardmask 224, eliminating faceting of the corners of the metal hardmask 224, while minimizing the reduction of etching of the vias that may be caused by the deposition layer 256. The dielectric layer 216 is etched (step 512). FIG. 2I is a cross-sectional view of the stack 200 after the dielectric layer 216 is further partially etched (step 512).

Figure 2J:
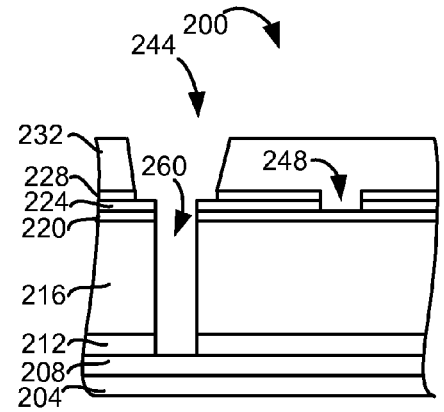

The thinning the planarization layer 232 (step 504), forming a deposition layer (step 508), and etching the dielectric layer 216 (step 512) are repeated again in this example. FIG. 2J is a cross-sectional view of the stack 200 after the dielectric layer 216 is etched again (step 512) at the end of the multistep cyclical process. The planarization layer 232 has been thinned by the thinning the planarization 232 step (step 504). A self-aligned via 260 has been etched through the etch stop layer 212 to the barrier layer 208. In this example, two-thirds of the planarization layer 232 has been thinned away. Preferably, at least two-thirds of the planarization layer 232 is thinned away during the etching of the dielectric layer 216 during the etching of the self-aligned vias 260. The selectivity of etching the dielectric layer 216 with respect to etching corners of the metal hardmask 224 is at least 20:1. More preferably, the selectivity of etching the dielectric layer is at least 100:1. Preferably, this process provides a metal hardmask corner faceting of less than 1 nm. More preferably, this process provides a metal hardmask corner faceting of 0 nm. Most preferably, this process provides an infinite corner metal hardmask selectivity.

Figure 2K:
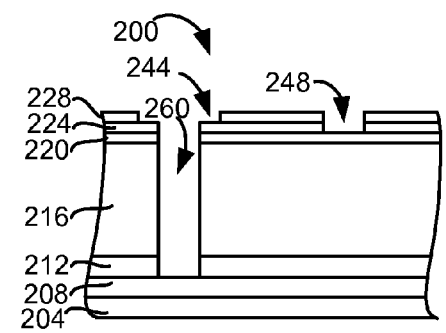

After the self-aligned vias 260 are etched in the dielectric layer 216, the planarization layer 232 is stripped (step 124). In this example an ion based strip process is used to remove the planarization layer 232. During this step, a low pressure of 20-60 mTorr is provided. A low bias is provided by providing no more than 500 W of 60 MHz power and no more than 50 W of 2 MHz power. A $CO_2$ based dielectric etch gas is provided. The stripping of a planarization layer 232 may cause metal hardmask 224 corner loss as well as via bowing. By providing a step in the at least one cycle that thins the planarization layer 232, the thinner planarization layer 232 allows for a shorter stripping time, which further reduces metal hardmask 224 corner loss and via bowing. FIG. 2K is a cross-sectional view of the stack 200 after the planarization layer has been stripped. In this example, the self-aligned via 260 is etched to the barrier layer 208.

Figure 6:
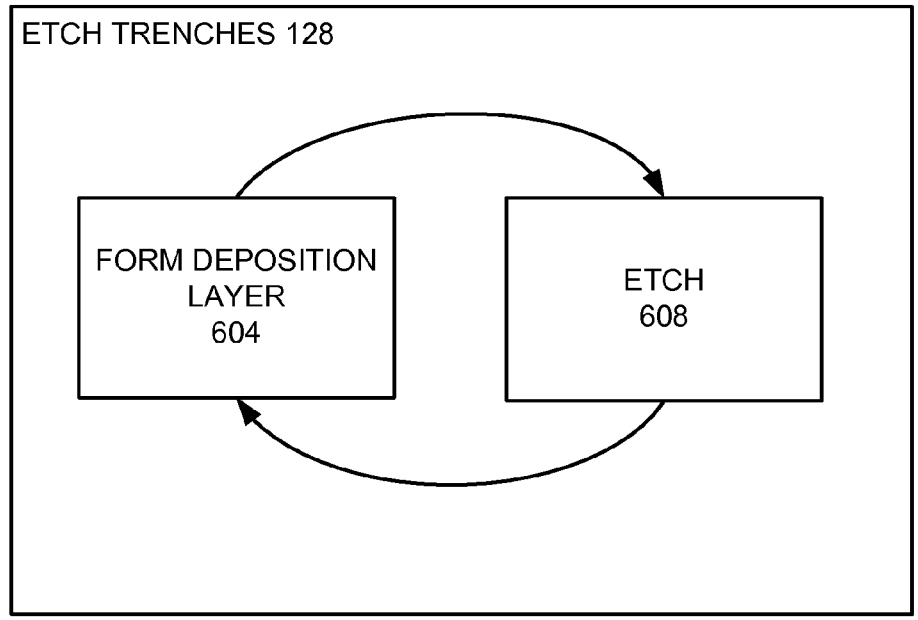
FIG. 6 is a more detailed flow chart of an etch trench step.

The trenches are etched (step 128). In this example, the etching of the trenches, also land the vias 260 on the substrate 204. FIG. 6 is a more detailed flow chart of the step of etching trenches (step 128). The etching the trenches (step 128) comprises at least one cycle, wherein each cycle comprises a formation of a deposition layer (step 604) and an etching (step 608).

Figure 2L:
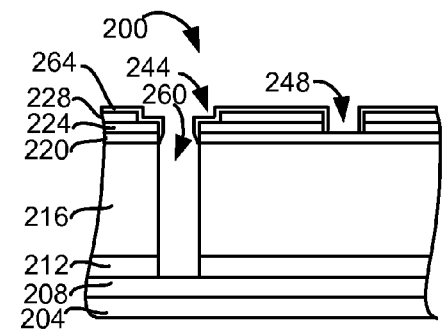

The formation of the deposition layer (step 604) provides a deposition gas comprising a hydrofluorocarbon gas. A very low bias regime is provided with no more than 300 W of 60 MHz power and less than <50 W of 2 MHz power provided for deposition. A deposition gas comprising hydrofluorocarbon is provided. FIG. 2L is a cross-sectional view of the stack 200 after a deposition layer 264 has been deposited. In one example, the deposition layer 264 is a passivating polymer deposited on the corners of the metal hardmask 224, but not on top of the second hardmask 228. In this example, the deposition layer 264 is deposited on the corners of the metal hardmask 224 and on top of the second hardmask 228, but is not deposited at the bottoms of the self-aligned vias 260. The deposition layer 264 masks lower layers and protects corners of the metal hardmask 224. In another example, the oxygen in the TEOS of the second hardmask 228 is used to burn up the polymer to prevent deposition on the second hardmask 228.

Figure 2M:
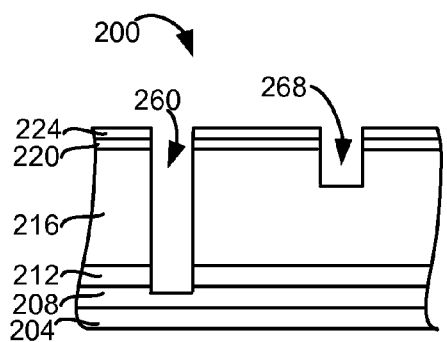

An etch step is provided (step 608). In this example, an etch gas comprising a hydrofluorocarbon, Ar, and nitrogen is provided. RF power is provided at frequencies of 2 MHz and 60 MHz for both state 1 (S1) and state 0 (S0) for the mixed mode pulsing etch. The mixed mode pulsing provides a 10-30% duty cycle, providing an effectively lower fluorine density than a non-pulsed regime. More preferably, the duty cycle is about 20%. The deposited layer on the metal hardmask 224 corner is etched away. However, the loss of the metal hardmask corner 224 is kept close to 0 nm. The etching process etches away some of the second hardmask 228 and the dielectric layer 216. FIG. 2M is a cross-sectional view of the stack 200 after an etch step 608, after several cycles for etching trenches 268 in the dielectric layer 216. In this example, the second hardmask 228 is removed during the etching of the trenches (step 128). In addition, in this example, the barrier layer 208 is partially etched.

Figure 2N:
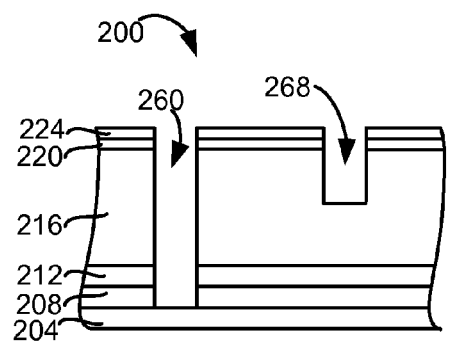

In this example, an additional trench etch or post etch treatment is provided to complete the via, by completely etching through the barrier layer 208 and further etching the trench 268. FIG. 2N is a cross-sectional view of the stack 200 after the additional trench etch or post etch treatment. The self-aligned via 260 is etched through the barrier layer 208 to the substrate 204. The trench 268 is also further etched. The stack 200 may be removed from the chamber 349, so that the etching, opening, and stripping may be done in a single chamber 349 in this example. In other examples, the processes may be performed in separate chambers. During the processes in the chamber 349, the bottom electrode 308 forming the ESC is maintained at a temperature of 0-20° C. to keep vapor pressure of $TiF_x$, such as $TiF_4$, by-products low.

Figure 2O:
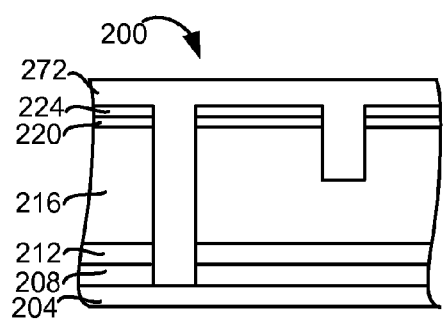

The features are filled (step 132). In one example, a barrier layer and seed layer may be formed before the features are filled with a conductive material such as copper or a copper alloy. An electroless deposition may be used to perform the conductive material filling. FIG. 2O is a cross-sectional view of the stack 200 after a conductive material 272 fills the features.

Figure 2P:
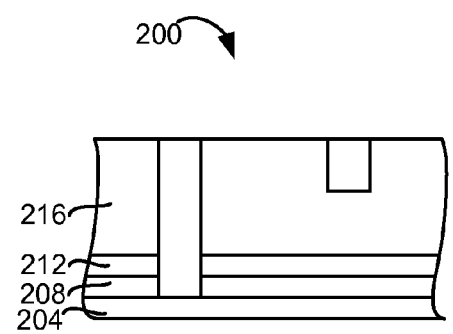

The stack 200 is planarized (step 136). In this example, a chemical mechanical polishing process is used to planarize the stack 200. FIG. 2P is a cross-sectional view of the stack 200 after the stack has been planarized.

In this example, a thin (≤10 nm) first hardmask layer 220, a thin (≤10 nm) metal hardmask layer 224, and a thin (≤10 nm) second hardmask layer 228 are provided. Such thin hardmask layers allow for the height to width aspect ratio of the features to be reduced during the filling of the features. It has been found that thick hardmasks increase the aspect ratio, which causes some of the bottoms of vias in trench-over-vias with trenches with a pitch ≤56 nm to fail to have metal deposition. This example helps to ensure deposition on the bottoms of such vias when the trench pitch ≤56 nm. Other examples help ensure metal deposition on the bottoms of such vias when the trench pitch ≤48 nm.

In addition, this example reduces corner TiN faceting at trench-over-via to less than 5 nm. More preferably, this example reduces trench-over-via corner faceting to 0 nm. It has been found that corner faceting greater than 10 nm causes unreliable Cu seed deposition and random Cu voids in electroplating. This is apparent where there is corner faceting when all trenches are well-filled, but only trench over vias show failure.

These examples provide very cost-effective, defect free solutions to these problems. In addition, these examples allow for metallization right after the etch process without a wet TiN removal and post processing, providing a simpler process. These examples improve the way logic back end of line (BEOL) Cu interconnects are formed in ≤10 nm technology. In addition, these examples eliminate via bowing. In addition, these examples also etch hardmask, while providing metal hardmask corner selectivity. The metal hardmask corner selectivity allows for thinner metal hardmasks and thinner hardmasks, since if the corner is not faceted, a thin metal hardmask would not be etched through. The above examples provide defect free contacts in the ≤10 nm technology node (<=56 nm pitch structures). This example provides elliptical vias contacting to bottom Cu or W using a self-aligned via etching scheme, where the diameters of the vias are greater than the widths of the trenches. In other examples, other self-aligned vias may be etched into a dielectric layer with a hardmask. A thinning, deposition, and then etch may be used to etch the dielectric layer, while eliminating hardmask corner faceting.

In other embodiments self-aligned contacts/vias may be etched in a dielectric layer using a silicon nitride (SiN) hardmask/spacer below a planarization layer using one or more three step cycles of thinning the planarization layer, forming a deposition layer on the hardmask Sin, and then etching the dielectric layer.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method of forming features in a low-k dielectric layer disposed below first hardmask layer, disposed below a metal hardmask, disposed below a second hardmask, which is disposed below a planarization layer, disposed below a via mask, comprising:

etching the planarization layer through the via mask to the second hardmask;

etching self-aligned contacts/vias in the low-k dielectric layer through the planarization layer, the metal hardmask, and the second hardmask, comprising at least one cycle, wherein each cycle comprises:

thinning the planarization layer, comprising the steps of:

flowing a planarization layer thinning gas from the gas source into the plasma processing chamber;

transforming the planarization layer thinning gas into a planarization layer thinning plasma, which thins the planarization layer; and stopping the flow of the planarization layer thinning gas;

forming a deposition layer on the second hardmask, the metal hardmask, and planarization layer comprising the steps of:

flowing a deposition gas from the gas source into the plasma processing chamber;

transforming the deposition gas into a deposition plasma, which forms a deposition layer on the hardmask and planarization layer; and stopping the flow of the deposition gas; and etching the low-k dielectric layer masked by the deposition layer comprising the steps of:

flowing an etch gas from the gas source into the plasma processing chamber;

transforming the etch gas into a deposition plasma, which etches the dielectric layer masked by the deposition layer; and stopping the flow of the etch gas removing the planarization layer;

etching trenches into the first hardmask layer; and etching trenches into the low-k dielectric layer through the first hardmask layer.

2. The method, as recited in claim 1, further comprising: filling the self-aligned vias with a conductive material; and removing the metal hardmask and the second hardmask.

3. The method, as recited in claim 2, wherein the etching trenches into the first hardmask layer comprises at least one cycle comprising:

forming a deposition layer on the metal hardmask; and etching the first hardmask layer masked by the deposition layer.

4. The method, as recited in claim 3, wherein the etching self-aligned contacts/vias provides a dielectric layer to corner hardmask etch selectivity greater than 100:1 and wherein the etching trenches into the first hardmask layer provides a first hardmask layer to corner metal hardmask etch selectivity greater than 100:1.

5. The method, as recited in claim 4, wherein the metal hardmask has a thickness no greater than 10 nm.

6. The method, as recited in claim 5, wherein the metal hardmask is a metal containing hardmask.

7. The method, as recited in claim 6, wherein the planarization layer is an organic planarization layer.

8. The method, as recited in claim 7, wherein the etching the self-aligned contacts/vias and the etching the trenches provide infinite metal hardmask corner selectivity.

9. The method, as recited in claim 1, wherein the thinning the planarization layer reduces an aspect ratio from at least 5:1 to less than 2:1.

10. The method, as recited in claim 1, wherein the etching the self-aligned contacts/vias and the etching the trenches provide infinite metal hardmask corner selectivity.

11. An apparatus for etching self-aligned contact/via features in a dielectric layer disposed below a hardmask, which is disposed below a planarization layer, comprising:

a plasma processing chamber, comprising:

a chamber wall forming a plasma processing chamber enclosure;

a substrate support for supporting a wafer within the plasma processing chamber enclosure;

a pressure regulator for regulating the pressure in the plasma processing chamber enclosure;

at least one electrode for providing power to the plasma processing chamber enclosure for sustaining a plasma;

a gas inlet for providing gas into the plasma processing chamber enclosure; and a gas outlet for exhausting gas from the plasma processing chamber enclosure;

at least one RF power source electrically connected to the at least one electrode;

a gas source in fluid connection with the gas inlet, the gas source: and a controller controllably connected to the gas source and the at least one RF power source, comprising:

at least one processor; and computer readable media, comprising:

computer readable code for flowing a planarization layer thinning gas from the gas source into the plasma processing chamber;

computer readable code for transforming the planarization layer thinning gas into a planarization layer thinning plasma, which thins the planarization layer;

computer readable code for stopping the flow of the planarization layer thinning gas;

computer readable code for flowing a deposition gas from the gas source into the plasma processing chamber;

computer readable code for transforming the deposition gas into a deposition plasma, which forms a deposition layer on the hardmask and planarization layer;

computer readable code for stopping the flow of the deposition gas;

computer readable code for flowing an etch gas from the gas source into the plasma processing chamber;

computer readable code for transforming the etch gas into a deposition plasma, which etches the dielectric layer masked by the deposition layer; and computer readable code for stopping the flow of the etch gas.

12. The apparatus, as recited in claim 11, wherein the computer readable media further comprises computer readable code for providing RF pulsing and gas pulsing.

13. The method, as recited in claim 12, wherein the computer readable media further comprises computer readable code for cyclically performing the computer readable code of claim 1.

* * * * *